United States Patent
Tsai et al.

(10) Patent No.: US 10,944,048 B2
(45) Date of Patent: Mar. 9, 2021

(54) SEMICONDUCTOR DEVICE WITH MAGNETIC TUNNEL JUNCTION

(71) Applicant: UNITED MICROELECTRONICS CORP., Hsin-Chu (TW)

(72) Inventors: Ya-Huei Tsai, Tainan (TW); Rai-Min Huang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/554,531

(22) Filed: Aug. 28, 2019

(65) Prior Publication Data

US 2021/0028353 A1 Jan. 28, 2021

(30) Foreign Application Priority Data

Jul. 22, 2019 (CN) .......................... 201910659797.9

(51) Int. Cl.
*H01L 43/08* (2006.01)
*H01L 43/02* (2006.01)
*H01L 27/22* (2006.01)

(52) U.S. Cl.
CPC ............ *H01L 43/08* (2013.01); *H01L 27/224* (2013.01); *H01L 43/02* (2013.01)

(58) Field of Classification Search
CPC .................................................. H01L 27/22–224
See application file for complete search history.

(56) References Cited

U.S. PATENT DOCUMENTS

| 2015/0263264 | A1* | 9/2015 | Hosotani | H01L 27/228 257/421 |
| 2018/0285005 | A1* | 10/2018 | Torng | G06N 3/0454 |
| 2019/0206928 | A1* | 7/2019 | Li | G11C 5/025 |
| 2019/0378971 | A1* | 12/2019 | Chu | G11C 11/161 |

* cited by examiner

*Primary Examiner* — Moazzam Hossain
*Assistant Examiner* — Mohammad A Rahman
(74) *Attorney, Agent, or Firm* — Winston Hsu

(57) ABSTRACT

A semiconductor device includes a substrate, an array of magnetic tunnel junctions (MTJs), an array of first dummy MTJs, and an array of second dummy MTJs. The substrate includes an array region defined thereon, and the array region includes at least an outermost corner. The array of MTJs is disposed in the array region. The array of the first dummy MTJs is disposed along the outermost corner of the array region. The array of the second dummy MTJs is disposed around the array region and the array of first dummy MTJs.

16 Claims, 5 Drawing Sheets

SEMICONDUCTOR DEVICE WITH MAGNETIC TUNNEL JUNCTION

BACKGROUND OF THE INVENTION

1. Field of the Invention

The present disclosure discloses a semiconductor device, in particular to a magnetoresistive random access memory (MRAM) device having dummy magnetic tunnel junctions (MTJs).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values.

Moreover, the characterization of utilizing giant magnetoresistance (GMR) materials to generate different resistance under different magnetized states could also be used to fabricate magnetoresistive random access memory (MRAM) devices, which typically has the advantage of keeping stored data even when the device is not connected to an electrical source.

The aforementioned MR effect has also been used in magnetic field sensor areas including but not limited to for example electronic compass devices used in global positioning system (GPS) of cellular phones for providing information regarding moving location to users. Currently, various magnetic field sensor technologies such as anisotropic magnetoresistance (AMR) sensors, GMR sensors, magnetic tunnel junction (MTJ) sensors have been widely developed in the market. Nevertheless, most of these products still pose numerous shortcomings such as high chip area, high cost, high power consumption, limited sensibility, easily affected by temperature variation, and low size uniformity of MTJs. Thus, how to come up with an improved device to resolve these issues has become an important task in this field.

SUMMARY OF THE INVENTION

According to one embodiment of the present disclosure, a semiconductor device includes a substrate, an array of magnetic tunnel junctions (MTJs), an array of first dummy MTJs, and an array of second dummy MTJs. The substrate includes an array region defined thereon, and the array region includes at least an outermost corner. The array of MTJs is disposed in the array region. The array of first dummy MTJs is disposed along the outermost corner of the array region. The array of second dummy MTJs is disposed around the array region and the array of first dummy MTJs.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
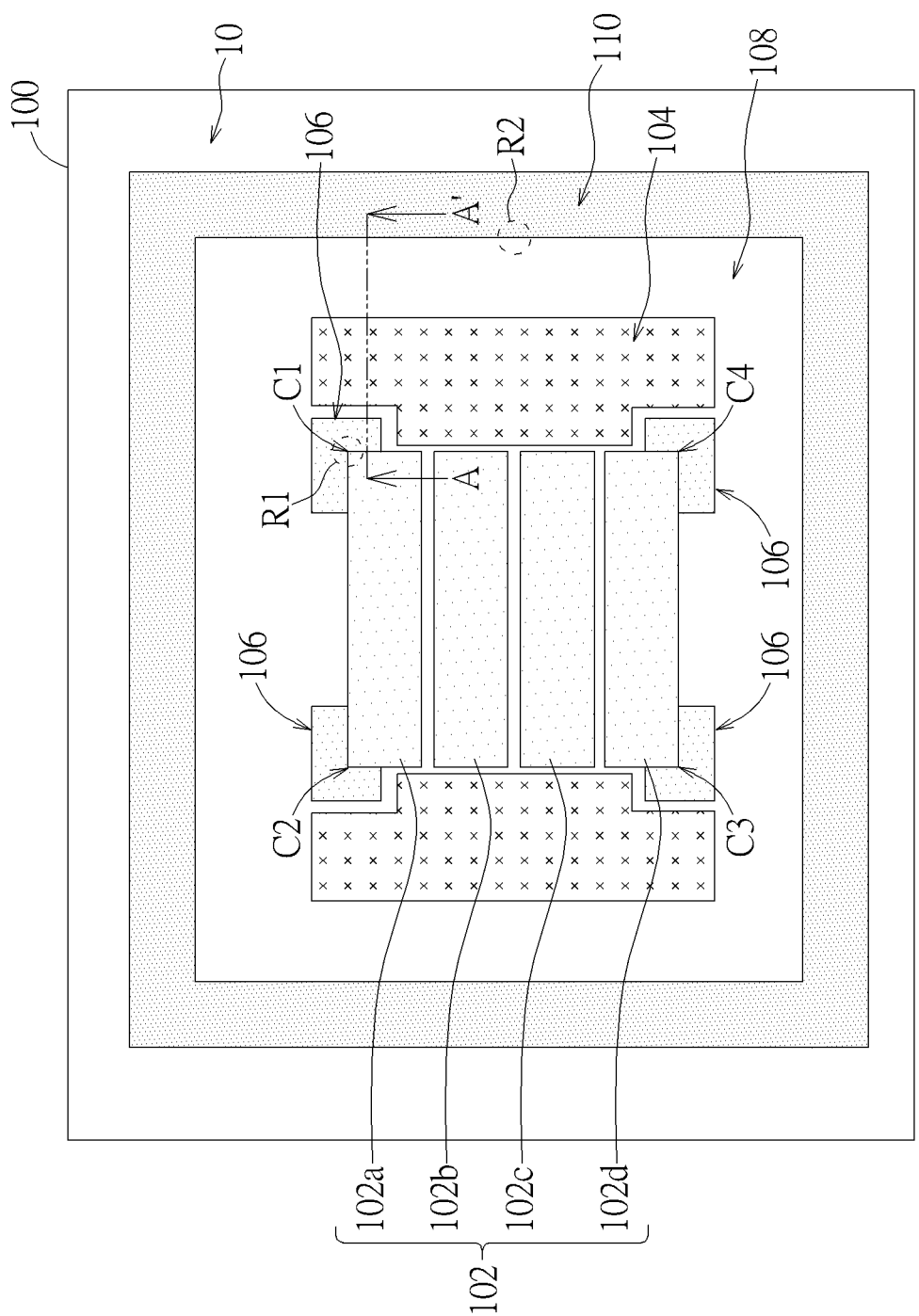
FIG. 1 is a top plan view of a semiconductor device in accordance with an embodiment of the present disclosure.

FIG. 1 is a top plan view of a semiconductor device in accordance with an embodiment of the present disclosure. As shown in FIG. 1, the semiconductor device 10 is disposed on the semiconductor substrate 100. The semiconductor device 10 may be a magnetoresistive random access memory (MRAM) device or a semiconductor device of any structure including a magnetic tunnel junction (MTJ) array. In addition, the semiconductor substrate 100 may be made of semiconductor material, and the semiconductor material may be selected from the group consisting of ruthenium, osmium, iridium complex, silicon carbide, and gallium arsenide, but not limited thereto. Furthermore, the "semiconductor device" disclosed herein may be a finished product, a semi-finished product or a work-in-process. Therefore, the semiconductor device 10 may have other electrical functions by treating the semiconductor device 10 with other suitable processes.

The semiconductor substrate 100 may include a plurality of regions, such as an array region 102, a logic region 104, a first dummy array region 106, a dummy interconnection region 108, and a second dummy array region 110. The array region 102 may be regarded as being located in the active region of the semiconductor device 10, and the first dummy array region 106, the dummy interconnection region 108, and the second dummy array region 110 may be regarded as being located in the peripheral region of the semiconductor device 10. Furthermore, the array region 102 may include a plurality of sub-array regions, such as four sub-array regions 102a, 102b, 102c, and 102d, and other structures, such word lines, interconnections or other suitable semiconductor structures, may be further disposed between two adjacent sub-array regions 102a, 102b, 102c, and 102d. Each of the sub-array regions 102a, 102b, 102c, and 102d may include a plurality of magnetic tunnel junctions (MTJs) having substantially the same size in an array arrangement, and each of the magnetic tunnel junctions may have a critical dimension between 30 nanometers (nm) and 80 nanometers.

In addition, the logic region 104 will be disposed on at least one side of the array region 102 and disposed between the array region 102 and the second dummy array region 110. In particular, the logic region 104 may include a plurality of interconnections that may be used to transmit electrical signals from the semiconductor device 10 among different devices or regions.

The first dummy array region 106 may be located adjacent to at least one outermost corner of the array region 102. For example, the first dummy array region 106 may be located at four outermost corners C1, C2, C3, and C4 of the array region 102, respectively. And the top view appearance of each of the first dummy array regions 106 may be of L-shaped. Therefore, the first dummy array regions 106 are separated from one another, and the distance between adjacent two first dummy array regions 106 is greater than the critical dimension of the magnetic tunnel junction, for example, greater than 80 nm, preferably greater than 500 nm. In addition, since the first dummy array region 106 and the logic region 104 are both located on at least one side of the array region 102, in order to avoid the overlap between the first dummy array region 106 and the logical region 104, the logic region 104 may include at least one recess region so as to accommodate the first dummy array region 106. Specifically, each of the first dummy array regions 106 may include a plurality of dummy magnetic tunnel junctions having substantially the same size in an array arrangement, and each of the dummy magnetic tunnel junctions may have a critical dimension between 30 nm and 80 nm. Since the dummy magnetic tunnel junctions in the first dummy array region 106 are formed simultaneously with the magnetic tunnel junctions in the array region 102, and the dummy magnetic tunnel junctions are disposed at the outermost corners C1, C2, C3, and C4 of the array region 102, the magnetic tunnel junctions in the array region 102 and adjacent to the outer corners C1, C2, C3, and C4 may have a similar etching environment during the etching process of forming the MTJs. Thus, the size uniformity of the magnetic tunnel junctions in the array region 102 may be improved successfully.

The dummy interconnection region 108 may be located on at least one side of the logic region 104, such as around all the perimeter of the logic region 104, and the dummy interconnection region 108 may be located between the logic region 104 and the second dummy array region 110. Specifically, the dummy interconnection region 108 may include a plurality of dummy interconnections that may be formed together with the interconnections in the logic region 104 through the same deposition and etching processes. In this way, the uniformity of the interconnections in the logic region 104 may be increased.

The second dummy array region 110 may be located on at least one side of the logic region 104, such as surrounding all the perimeter of the logic region 104, surrounding all the perimeter of the first dummy array region 106, or surrounding the dummy interconnection region 108. Specifically, the second dummy array region 110 may include a plurality of dummy magnetic tunnel junctions having substantially the same size in an array arrangement, and the critical dimension of each dummy magnetic tunnel junction may be between 340 nm and 680 nm, but is not limited to. Since the dummy magnetic tunnel junctions in the second dummy array region 110 and the magnetic tunnel junctions in the array region 102 are formed simultaneously, the uniformity of the size of the magnetic tunnel junctions in the array region 102 may also be improved.

Figure 2:
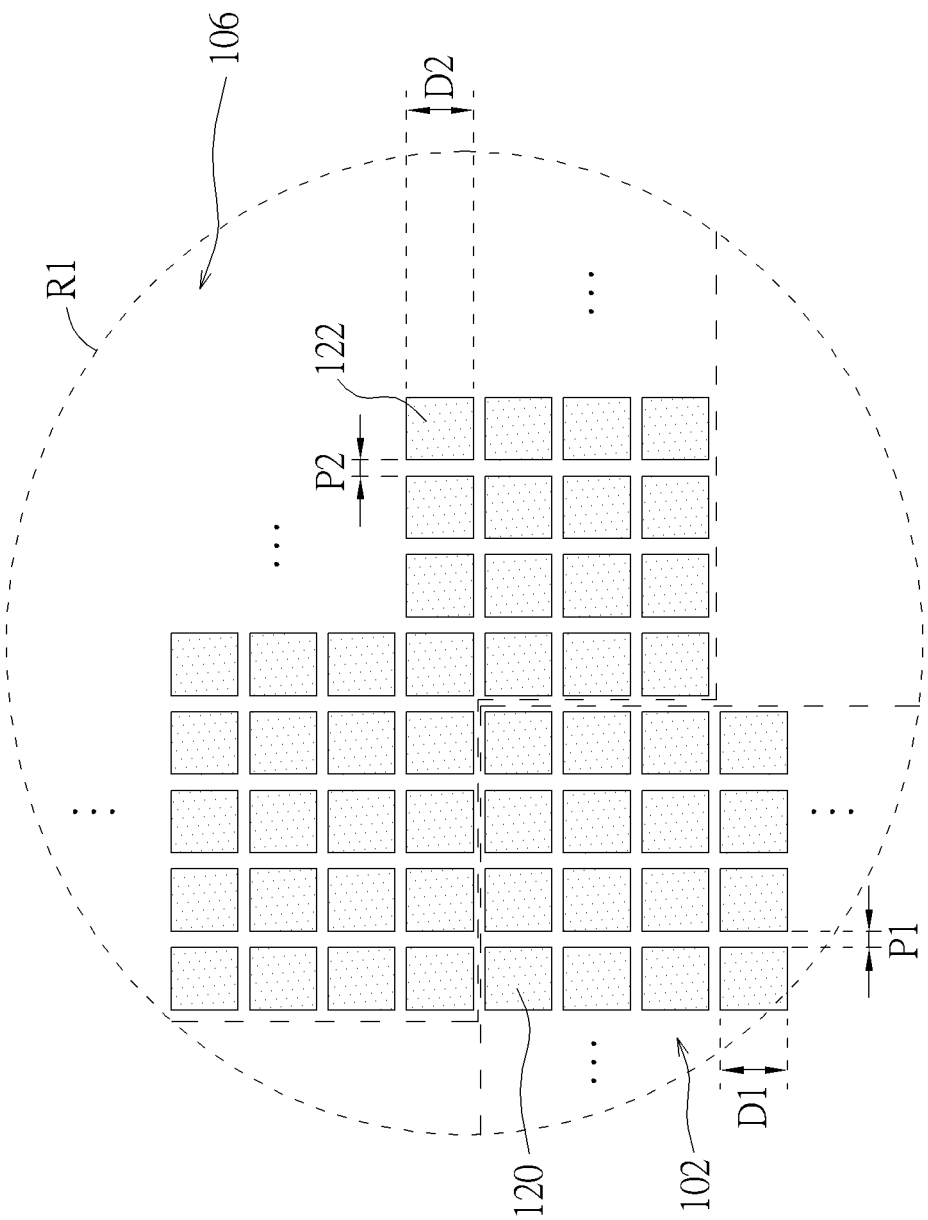
FIG. 2 is an enlarged schematic diagram of a region adjacent to a corner of an array region in accordance with an embodiment of the present disclosure.

FIG. 2 is an enlarged schematic diagram of a region adjacent to a corner of an array region in accordance with an embodiment of the present disclosure. As shown in FIG. 2, for the array region 102, a plurality of rectangular magnetic tunnel junctions 120 are disposed in the array region 102 in an array arrangement, and the critical dimension D1 and the pitch P1 of each of the magnetic tunnel junctions 120 are substantially the same, respectively. In addition, for the first dummy array region 106, a plurality of rectangular first dummy magnetic tunnel junctions 122 are also disposed in the first dummy array region 106 in an array arrangement. The critical dimension D2 and the pitch P2 of each of the magnetic tunnel junctions 122 are substantially the same, respectively. According to this embodiment, the array of the dummy magnetic tunnel junctions 122 may be considered as an outward extension of the array of the magnetic tunnel junctions 120. Therefore, the arrangement, the critical dimensions, and the pitches of the dummy magnetic tunnel junctions 122 may be substantially the same with those of the magnetic tunnel junction 120, respectively. For example, the critical dimensions D1 and D2 may be between 30 nanometers and 80 nanometers, and the pitches P1 and P2 may be between 20 nanometers and 150 nanometers. According to other embodiments, for the array of the first dummy magnetic tunnel junction 122 located in the first dummy array region 106, the sizes of the first dummy magnetic tunnel junctions 122 may become smaller and the pitches of the first dummy magnetic tunnel junctions 122 may become larger as the distances between those first dummy magnetic tunnel junctions 122 and the outermost corners of the logic region 10 increase.

Figure 3:
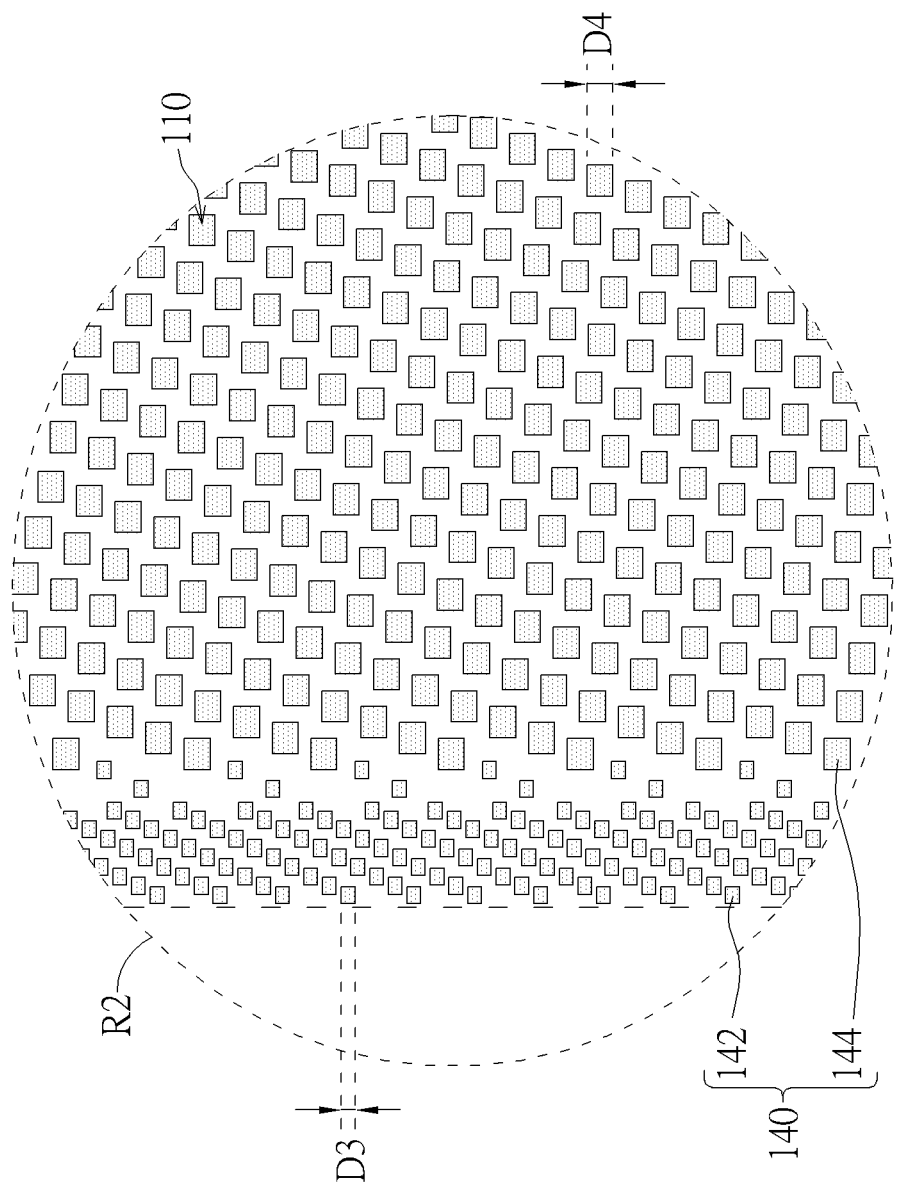
FIG. 3 is an enlarged schematic diagram of a region of a peripheral region of a semiconductor device in accordance with an embodiment of the present disclosure.

FIG. 3 is an enlarged schematic diagram of a region of a peripheral region of a semiconductor device in accordance with an embodiment of the present disclosure. As shown in FIG. 3, for the second dummy array region 110, a plurality of rectangular second dummy magnetic tunnel junctions 140 may be an array arranged in a staggered arrangement, but is not limited thereto. The second dummy magnetic tunnel junctions 140 may include magnetic tunnel junctions of different sizes. For example, the second dummy magnetic tunnel junction 142 adjacent to the dummy interconnection region 108 may have a smaller critical dimension D3, while the second dummy magnetic tunnel junction 144 away from the dummy interconnection region 108 may have a larger critical dimension D4. The critical dimension D3 and the critical dimension D4 are both between 340 nm and 680 nm, and the critical dimension D3 is smaller than the critical dimension D4. In addition, the critical dimensions of the second dummy magnetic tunnel junctions 142 and 144 in the second dummy array region 110 may be greater than the critical dimensions of the first dummy magnetic tunnel junctions 122 in the first dummy array region 106.

Figure 4:
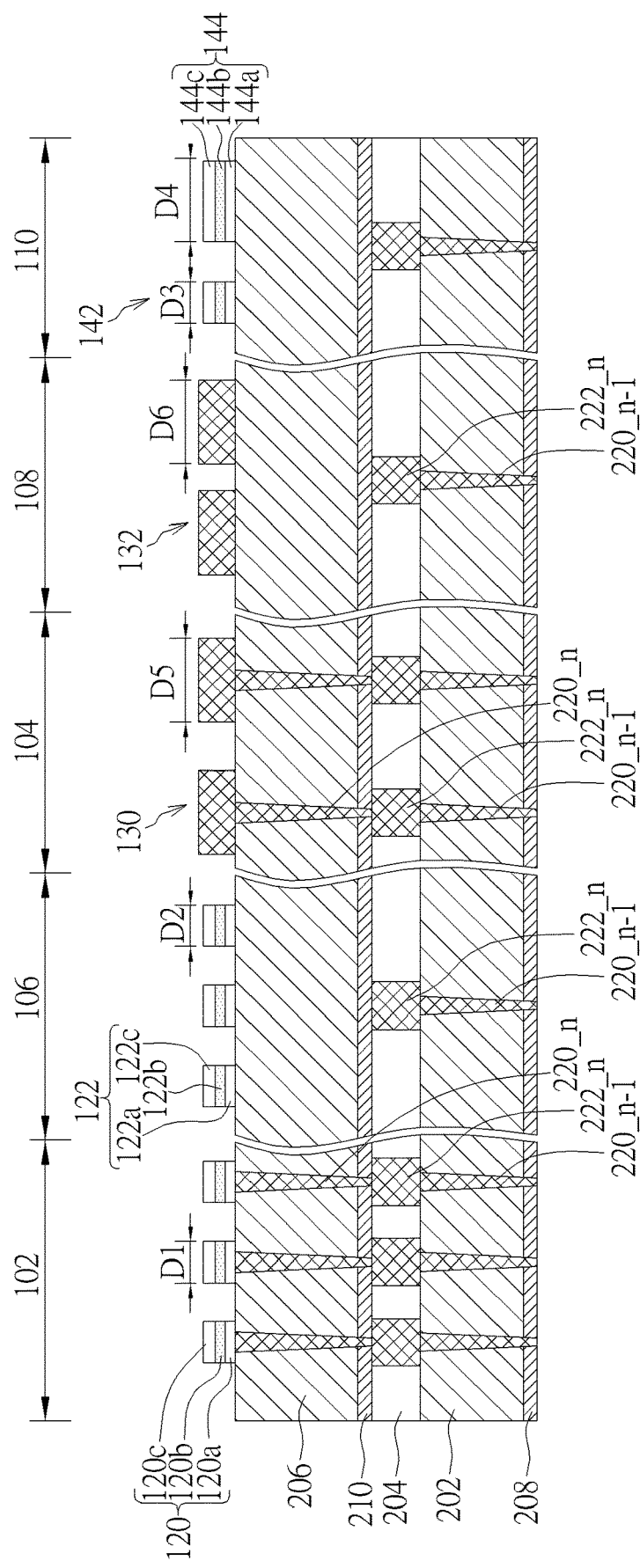
FIG. 4 is a schematic cross-sectional diagram of a semiconductor device taken along a line A-A' of FIG. 1 in accordance with an embodiment of the present disclosure.

FIG. 4 is a schematic cross-sectional diagram of a semiconductor device taken along a line A-A' of FIG. 1 in accordance with an embodiment of the present disclosure. According to an embodiment of the present disclosure, a first interlayer dielectric 202, a second interlayer dielectric 204, and a second interlayer dielectric 206 may be sequentially disposed on the semiconductor substrate. The conductive vias 220_n−1, the conductive interconnects 222_n, and the conductive plugs 220_n are disposed in the first interlayer dielectric 202, the second interlayer dielectric 204, and the second interlayer dielectric 206, respectively. In addition, an etch stop layer 208 and 210 may be disposed on the surface of the interlayer dielectric layer, and the etch stop layers 208 and 210 may be disposed corresponding to the bottoms of the conductive plugs 220_n−1 and 220_n to facilitate in fabricating the holes in the layer 202 and the third interlayer dielectric 206, which are used to accommodate the conductive plugs 220_n−1 and 220_n. According to an embodiment of the present disclosure, the conductive plugs 220_n, 220_n−1, and the conductive interconnect 222_n may further include a barrier layer and a metal layer, where the barrier layer may be selected from the group consisting of titanium (Ti), titanium nitride (TiN), germanium (Ta) and tantalum nitride (TaN), and the metal layer may be selected from the group consisting of tungsten (W), copper (Cu), aluminum (Al), titanium aluminum alloy (TiAl), cobalt tungsten phosphide (CoWP), but is not limited thereto. The interlayer dielectric layers 202, 204, and 206 may include ruthenium oxide, and the etch stop layers 208 and 210 may include nitrogen doped carbide (NDC), tantalum nitride, or silicon carbon nitride (SiCN), but is not limited thereto.

A magnetic tunnel junction 120, a first dummy magnetic tunnel junction 122, an interconnection 130, a dummy interconnection 132, and a second dummy magnetic tunnel junctions 142 and 144 may be disposed on the surface of the third interlayer dielectric 206, and are respectively disposed in the array region 102, the first dummy array region 106, the logic region 104, the dummy interconnection region 108, and the second dummy array region 110.

Specifically, each of the magnetic tunnel junctions 120 may include at least a fixed layer 120a, a tunneling insulating layer 120b, and a free layer 120c, or further include two electrode layers respectively disposed on the bottom surface of the fixed layer 120a and the top surface of the free layer 120c. Each of the first dummy magnetic tunnel junctions 122 may be electrically connected to other devices through conductive plugs 220_n disposed below. According to one embodiment, the fixed layer 120a may be made of an antiferromagnetic (AFM) material such as iron manganese (FeMn), platinum manganese (PtMn), lanthanum manganese (IrMn), nickel oxide (NiO), or the like. It is used to fix or limit the direction of the magnetic moment of adjacent layers. The free layer 120c may be made of a ferromagnetic material such as iron, cobalt, nickel or an alloy thereof, such as cobalt-iron-boron (CoFeB), but is not limited thereto, in which the magnetized direction of the free layer 120c could be altered freely depending on the influence of outside magnetic field. The tunneling insulating layer 120b may be made of an insulating material containing an oxide such as alumina ($AlO_x$) or magnesium oxide (MgO), but is not limited thereto.

In addition, the first dummy magnetic tunnel junctions 122 located in the first dummy array region 106 and the second dummy magnetic tunnel junctions 142 and 144 located in the second dummy array region 110 have structures similar to the structures of the magnetic tunnel junctions 120. Each of which may include at least a fixed layer 122a and 144a, a tunneling insulating layer 122b and 144b, and a free layer 122c and 144c, or two further electrode layers respectively disposed on the bottom surface of the fixed layer 120a and the top surface of the free layer 120c. However, the first dummy magnetic tunnel junctions 122 and the second dummy magnetic tunnel junctions 142 and 144 are not electrically connected to the lower conductive interconnect 222_n and the conductive plug 220_n-1. That is, the first dummy magnetic tunnel junctions 122 and second dummy magnetic tunnel junctions 142 and 144 are not used to transmit electrical signals.

In addition, the logic region 104 and the dummy interconnection region 108 may be respectively provided with an interconnection 130 and a dummy interconnection 132. The interconnection 130 and the dummy interconnection 132 may have the same critical dimension D5 and D6 or the same material composition. However, the interconnection 130 in the logic region 104 may be used to transmit electrical signals, so the interconnection 130 may be electrically connected from the lower conductive plug 220_n. In contrast, the dummy interconnection 132 in the dummy interconnection region 108 may not be used to transmit electrical signals, so the dummy interconnection 132 is not electrically connected to the underlying conductive plug 220_n.

Figure 5:
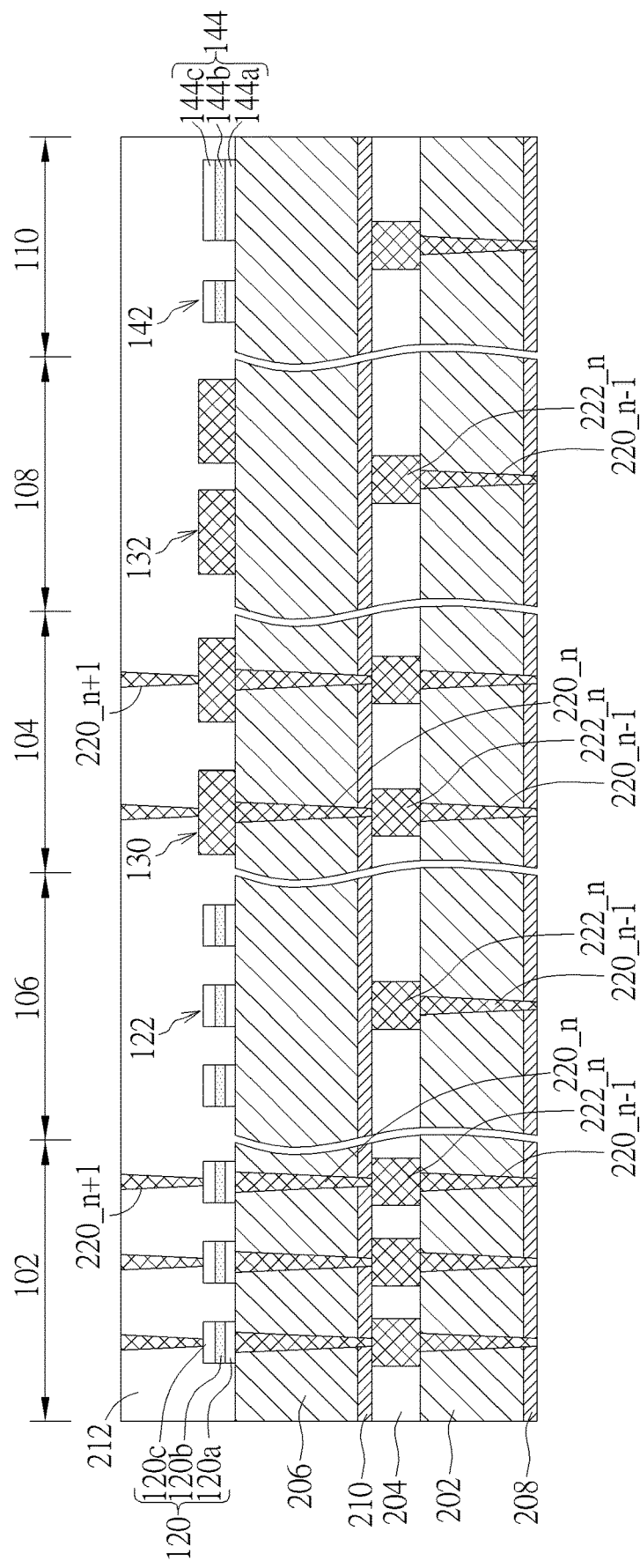
FIG. 5 is a schematic cross-sectional diagram of a semiconductor device taken along a line A-A' of FIG. 1 in accordance with an embodiment of the present disclosure.

FIG. 5 is a schematic cross-sectional diagram of a semiconductor device taken along a line A-A' of FIG. 1 in accordance with an embodiment of the present disclosure. The structure of this embodiment is similar to the structure shown in FIG. 4, however, a fourth interlayer dielectric 212 and a conductive plug 220_n+1 are further disposed on the surface of the third interlayer dielectric 206. The fourth interlayer dielectric 212 covers the magnetic tunnel junction 120, the first dummy magnetic tunnel junction 122, the interconnection 130, the dummy interconnection 132, and the second dummy magnetic tunnel junctions 142 and 144. The conductive plugs 220_n+1 are electrically connected to the magnetic tunnel junctions 120 in the array region 102 and the interconnections 130 in the logic regions 104, respectively. In contrast, the conductive plug 220_n+1 may not be electrically connected to the first dummy magnetic tunnel junctions 122, the dummy interconnection 132, and the second dummy magnetic tunnel junctions 142 and 144. Therefore, the electrical signal may be further transmitted to or transmitted from the magnetic tunnel junctions 120 and the interconnection 130 through the conductive plug 220_n+1.

According to the above embodiments, the first dummy magnetic tunnel junctions in the first dummy array region the magnetic tunnel junctions in the array region are formed simultaneously. Also, the array of dummy magnetic tunnel junctions, which is arranged in an L-shaped, is disposed at at least one outermost corner of the array region, or the critical dimensions and arrangement of the magnetic tunnel junctions in the array region and in the first dummy array region are substantially the same. In this way, the magnetic tunnel junctions located in the array region or near the outermost corners of the array region may have a similar etching environment, thereby improving the size or dimension uniformity of the entire magnetic tunnel junctions in the array region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising magnetic tunnel junctions, comprising:
a substrate, comprising an array region defined thereon, wherein the array region comprises at least an outermost corner;
an array of magnetic tunnel junctions (MTJs), disposed in the array region and electrically connected to conductive plug respectively;
an array of first dummy MTJs, disposed along the outermost corner of the array region and not surrounding the array region; and
an array of second dummy MTJs, disposed around the array region and the array of the first dummy MTJs, wherein the first dummy MTJs and the second dummy MTJs are not electrically connected to any conductive plug.

2. The semiconductor device of claim 1, wherein each of the MTJ of the array of the MTJs has a critical dimension between 30 nm to 80 nm.

3. The semiconductor device of claim 2, wherein the critical dimensions of the MTJs and pitches between two adjacent MTJs are respectively substantially identical with critical dimensions of the first dummy MTJs and pitches between two adjacent first dummy MTJs.

4. The semiconductor device of claim 1, wherein each of the first dummy MTJs has a critical dimension between 30 nm and 80 nm.

5. The semiconductor device of claim 1, wherein each of the first dummy MTJs is of rectangle when viewed from a top down perspective.

6. The semiconductor device of claim 1, wherein the first dummy MTJs are uniformly sized dummy MTJs.

7. The semiconductor device of claim 1, wherein the array of the first dummy MTJs is an L-shaped array.

8. The semiconductor device of claim 1, wherein each of the second dummy MTJs has a critical dimension greater than a critical dimension of each of the first dummy MTJs.

9. The semiconductor device of claim 8, wherein each of the second dummy MTJs has a critical dimension between 340 nm to 680 nm.

10. The semiconductor device of claim 1, wherein the array of the second dummy MTJs is in a staggered arrangement.

11. The semiconductor device of claim 1, wherein the semiconductor device is a magnetoresistive random access memory (MRAM).

12. The semiconductor device of claim 1, wherein the array region comprises a plurality of the outermost corners, and the first dummy MTJs constitute a plurality of sub-arrays disposed along peripheries of the outermost corners.

13. The semiconductor device of claim 12, wherein each of the sub-arrays of the first dummy MTJs is an L-shaped array.

14. The semiconductor device of claim 13, wherein a distance between two adjacent sub-arrays of the first dummy MTJs is greater than a critical dimension of each of the first dummy MTJs.

15. The semiconductor device of claim 1, wherein the semiconductor device further comprises a plurality of interconnections disposed between the array region and the array of the second dummy MTJs.

16. The semiconductor device of claim 15, wherein the semiconductor device further comprises a plurality of dummy interconnections disposed between the interconnections and the array of the second dummy MTJs.

\* \* \* \* \*